US010270005B2

(12) United States Patent
Fan

(10) Patent No.: US 10,270,005 B2
(45) Date of Patent: Apr. 23, 2019

(54) GRAPHENE LIGHT EMITTING DISPLAY AND METHOD OF MANUFACTURING THE SAME

(71) Applicant: Shenzhen China Star Optoelectronics Technology Co., Ltd., Shenzhen, Guangdong (CN)

(72) Inventor: Yong Fan, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 15/567,703

(22) PCT Filed: Jul. 3, 2017

(86) PCT No.: PCT/CN2017/091498
§ 371 (c)(1),
(2) Date: Oct. 19, 2017

(87) PCT Pub. No.: WO2018/171080
PCT Pub. Date: Sep. 27, 2018

(65) Prior Publication Data

US 2018/0294377 A1 Oct. 11, 2018

(30) Foreign Application Priority Data

Mar. 24, 2017 (CN) .......................... 2017 1 0182670

(51) Int. Cl.
*H01L 21/00* (2006.01)
*H01L 29/06* (2006.01)
(Continued)

(52) U.S. Cl.
CPC ........ *H01L 33/0041* (2013.01); *H01L 27/156* (2013.01); *H01L 33/0054* (2013.01);
(Continued)

(58) Field of Classification Search
CPC ............... H01L 33/0041; H01L 27/156; H01L 33/0054; H01L 33/34; H01L 33/405; H01L 33/44; H01L 33/06; H01L 2933/0016
(Continued)

(56) References Cited

U.S. PATENT DOCUMENTS

2015/0243849 A1* 8/2015 Stroetmann ......... H01L 29/1606 257/13

FOREIGN PATENT DOCUMENTS

CN 102208755 A 10/2011
CN 103050625 A 4/2013
(Continued)

*Primary Examiner* — Thinh T Nguyen
(74) *Attorney, Agent, or Firm* — Mintz Levin Cohn Ferris Glovsky and Popeo, P.C.; Kongsik Kim

(57) ABSTRACT

A graphene light emitting display and a method of manufacturing the same are disclosed. The method comprises: manufacturing a graphene oxide (GO) thin film on a surface of a substrate with a thin film transistor formed thereon; providing a photomask corresponding to the GO thin film to form a source electrode, a drain electrode and a graphene quantum dot layer of a graphene light emitting transistor; and wherein the photomask includes: a complete transparent part corresponding to the region in which the source electrode and the drain electrode are located; a light blocking part corresponding to the region in which the thin film transistor is located; and a semitransparent part corresponding to the region in which the graphene quantum dot layer is located; wherein an insulating layer and a water and oxygen isolating layer are formed sequentially on a surface of the substrate with the graphene light emitting transistor formed thereon.

9 Claims, 3 Drawing Sheets

200

(51) Int. Cl.
*H01L 33/00* (2010.01)
*H01L 27/15* (2006.01)
*H01L 33/34* (2010.01)
*H01L 33/40* (2010.01)
*H01L 33/44* (2010.01)
*H01L 33/06* (2010.01)

(52) U.S. Cl.
CPC .............. *H01L 33/06* (2013.01); *H01L 33/34* (2013.01); *H01L 33/405* (2013.01); *H01L 33/44* (2013.01); *H01L 2933/0016* (2013.01)

(58) Field of Classification Search
USPC .......... 257/13, 40, 59, 72; 438/22, 128, 149, 438/151
See application file for complete search history.

(56) References Cited

FOREIGN PATENT DOCUMENTS

| | | | |
|---|---|---|---|
| CN | 104124348 | A | 10/2014 |
| CN | 104752547 | A | 7/2015 |
| CN | 104752549 | A | 7/2015 |
| CN | 105244415 | A | 1/2016 |
| CN | 106782352 | A | 5/2017 |
| CN | 106876539 | A | 6/2017 |

* cited by examiner

GRAPHENE LIGHT EMITTING DISPLAY AND METHOD OF MANUFACTURING THE SAME

CROSS-REFERENCES TO RELATED APPLICATIONS

This application is a U.S. national phase application, pursuant to 35 U.S.C. § 371, of PCT/CN2017/091498, filed Jul. 3, 2017, designating the United States, which claims priority to Chinese Application No. 201710182670.3, filed Mar. 24, 2017. The entire contents of the aforementioned patent applications are incorporated herein by this reference.

TECHNICAL FIELD

The present disclosure belongs to a technical field of a liquid crystal display, and particularly, relates to a novel graphene light emitting display and a method of manufacturing the same.

BACKGROUND ART

With the development of technology and the improvement of life requirements of people, graphene has excellent characteristics such as hard texture, high transparency (transmissivity≈97.7%), high thermal conductivity (up to 5300 W/m·K), a high electron mobility (more than 15000 $cm^2/V·s$) and so on, and its application on the display is gradually increasing in recent years, especially on a touch screen (as an alternative to a traditional transparent conductive thin film ITO) and in the aspect of LED.

In recent years, due to the appearance of a graphene light emitting element, the application of the graphene in the field of display can be extended. The color of the light emitted by a graphene light emitting transistor manufactured by using a graphene material can be adjusted by a gate voltage.

However, at present, the manufacturing technology and process of applying the graphene to manufacture a flexible display device is complex, resulting in high cost, and it is urgent to simplify the manufacturing process to reduce the cost.

For example, a reduced graphene, which may be converted by using grapheme oxide after being irradiated by light, has a conductive characteristic suitable for a source electrode and a drain electrode; and by adjusting the lighting processing parameters, graphene oxide can be partially converted to reduced graphene, thereby having a semiconductor characteristic. Graphene oxide without being irradiated by light has the characteristic of an insulator and can be further used for the manufacturing of an insulating layer. However, since masks of different patterns and different light irradiation parameters are needed, these procedures need to be performed independently one by one, which wastes time and energy.

SUMMARY

In order to solve the above problem existing in the prior art, the present disclosure provides a method of manufacturing a graphene light emitting display, including the following steps: manufacturing a graphene oxide thin film on a surface of a substrate with a thin film transistor formed thereon; coating evenly a graphene oxide dispersion on a surface of the substrate with a thin film transistor formed thereon to form the graphene oxide thin film; providing a photomask to correspond to the graphene oxide thin film, so that light is radiated to the graphene oxide thin film through the photomask, to form a source electrode, a drain electrode and a graphene quantum dot layer of a graphene light emitting transistor; and forming an insulating layer and a water and oxygen isolating layer sequentially on a surface of a substrate with the graphene light emitting transistor formed thereon, wherein the photomask includes: a complete transparent part corresponding to the region in which the source electrode and the drain electrode are located; a light blocking part corresponding to the region in which the thin film transistor is located; and a semitransparent part corresponding to the region in which the graphene quantum dot layer is located. The light may be blue light. The operational wavelength of the light may be 420-660 nm. A material for the graphene gate may be one of a molybdenum-aluminum alloy, an aluminum-silver alloy and a copper-molybdenum-aluminum alloy.

The present disclosure further provides a graphene light emitting display including a substrate and a plurality of sub pixel units disposed on the substrate. Each of the sub pixel units includes: a driving module formed on the substrate; a switch module formed on the substrate; a gate formed on the substrate; a gate insulating layer formed on the gate; a source electrode formed on the gate insulating layer; a drain electrode formed on the gate insulating layer; and a graphene quantum dot layer connected between the source electrode and the drain electrode. The switch module is electrically connected to the source electrode, and the driving module is electrically connected to the gate. The driving module may make the gate have voltage modes including at least the following three modes: a first voltage mode which makes the graphene quantum dot layer emit red light, a second voltage mode which makes the graphene quantum dot layer emit green light, and a third voltage mode which makes the graphene quantum dot layer emit blue light. When the gate is in the first voltage mode, the operating voltage range may be 0-12V. When the gate is in the second voltage mode, the operating voltage range may be 20-35V. When the gate is in the third voltage mode, the operating voltage range may be 40-50V. A material for the graphene gate may be one of a molybdenum-aluminum alloy, an aluminum-silver alloy and a copper-molybdenum-aluminum alloy. The graphene light emitting display may further include an insulating layer formed on the graphene quantum dot layer and an oxygen isolating layer formed on the insulating layer. The display may further include water between the insulating layer and the oxygen isolating layer.

The present disclosure designs a graphene light emitting display driven by active arrays using a graphene light emitting transistor, which can realize the purpose that a graphene light emitting display displays with a large area and a high brightness. Compared with traditional AMOLED (Active Matrix Organic Light Emitting Diode), the display does not need a color filter, the materials of RGB light emitting layers are the same, the manufacturing processes of photomasks are saved, equipment investment for the production line is reduced, and the light emitting materials are cheap and easily get, thus it has a cost advantage.

Furthermore, on one hand, the active arrays graphene light emitting display is the same as the top light emitting AMOLED, of which the light emitting region has a very high aperture ratio, so that the brightness is improved and the driving power is reduced; and on the other hand, as compared to traditional AMOLED, since it does not need to manufacturing a top electrode, and the source and drain electrodes of the graphene light emitting transistor use the same electrode material, the active arrays graphene light emitting display can be formed by using the manufacturing process of one photomask, moreover, the gate of the graphene transistor and the gate of TFT also can use the same material and manufacturing process, therefore, as compared to traditional AMOLED top light emitting display, one step is reduced to manufacture the electrode, which simplifies the process.

BRIEF DESCRIPTION OF THE DRAWINGS

The above and other aspects, characteristics and advantages of embodiments of the present disclosure will become more apparent, by the following descriptions taken in conjunction with the accompanying drawings, in which.

DETAILED DESCRIPTION OF EXEMPLARY EMBODIMENTS

Embodiments of the present disclosure will be described in detail below by referring to the accompany drawings. However, the present disclosure can be implemented in many different forms, and the present disclosure should not be constructed to be limited hereto. Instead, these embodiments are provided for explaining the principle and actual application of the present disclosure, so that those skilled in the art would understand various embodiments and modifications which are suitable for specific intended applications of the present disclosure.

The present disclosure provides a method of manufacturing a graphene light emitting display, a characteristic that the degrees of reduction of graphene oxide are different at different light irradiating time is used, so that a source electrode, a drain electrode and a graphene quantum dot layer of a light emitting device can be manufactured by using one photomask.

Figure 1:
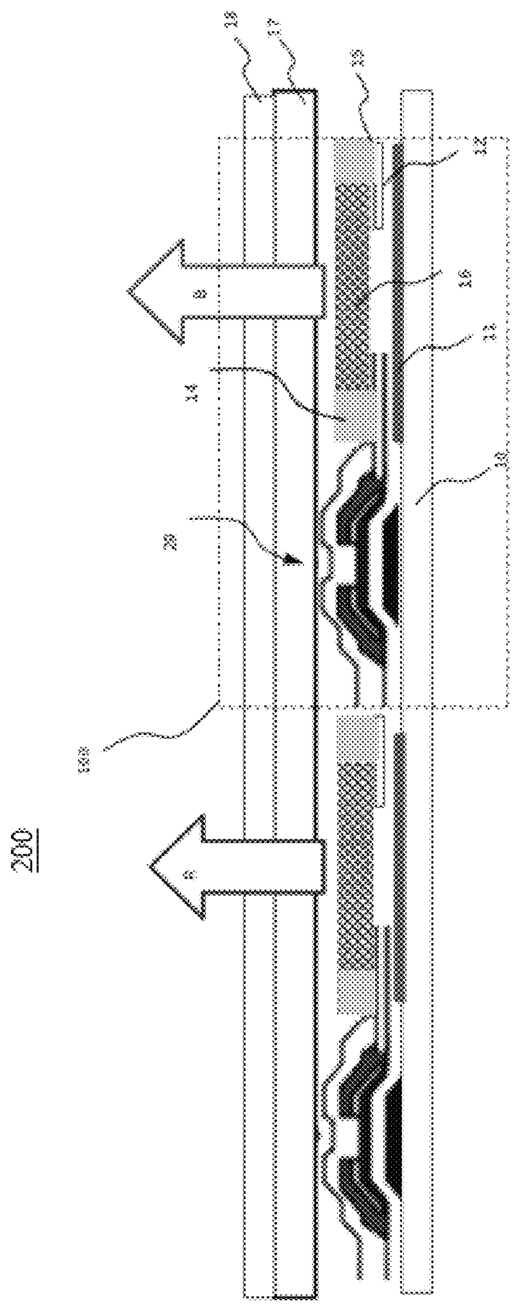
FIG. 1 is a structural schematic view of a graphene light emitting display according to an embodiment of the present disclosure.

As shown in FIG. 1, a graphene light emitting display 200 of the present disclosure includes a substrate 10 and a plurality of sub pixel units 100 disposed on the substrate 10. Each of the sub pixel units 100 includes: a driving module (limited by view, not shown); a switch module 20; a gate 11 formed on the substrate 10; a gate insulating layer 12 formed on the gate 11; a source electrode 14 formed on the gate insulating layer 12; a drain electrode 15 formed on the gate insulating layer 12; and a graphene quantum dot layer 16 connected between the source electrode 14 and the drain electrode 15. The switch module 20 is electrically connected to the source electrode 14, and the driving module is electrically connected to the gate 11.

The graphene light emitting display 200 further includes an insulating layer 17 on the graphene quantum dot layer 16 and an oxygen isolating layer 18 form on the insulating layer 17. The display 200 may further include water between the insulating layer 17 and the oxygen isolating layer 18.

The driving module and the switch module belong to a thin film transistor (TFT) array, and are used for supplying a driving voltage to the sub pixel unit, and controlling ON and OFF between each sub pixel unit and a power source.

Particularly, the structure of a graphene light emitting transistor device includes: a gate 11, a gate insulating layer 12 formed on a surface of the gate 11, a source electrode 14 and a drain electrode 15 formed on the gate insulating layer 12 and a graphene quantum dot layer 16 disposed between the source electrode 14 and the drain electrode 15. The graphene light emitting transistor of the present disclosure is a top light emitting device, in order to ensure a high light emitting efficiency, a material for the gate is selected from one of a molybdenum-aluminum alloy, an aluminum-silver alloy and a copper-molybdenum-aluminum alloy, and the gate has a relatively high light reflection characteristic, of which the reflectivity to a visible light is more than 80%, so that the formed graphene light emitting transistor has a high light emitting efficiency.

Gates in each row of sub pixel units are electrically connected to each other, and the color of the light emitted by each row of the graphene light emitting transistor may be controlled by a corresponding gate voltage of each row by using the characteristic that the color of the light emitted by the graphene light emitting transistor can be adjusted according to the gate voltage. The gate voltage of the row is supplied by the driving module, so that the gate has at least three voltage modes.

For example, when the gate is in a first voltage mode, at this time, the operating voltage is a low voltage, and the operating voltage range is 0-12V. The graphene quantum dot layers in the sub pixel units of the whole row all emit red light at the driving of the low voltage. When the gate is in a second voltage mode, at this time, the operating voltage is an intermediate voltage, and the operating voltage range is 20-35V. The graphene quantum dot layers in the sub pixel units of the whole row all emit green light (not shown in the figure) at the driving of the intermediate voltage. When the gate is in a third voltage mode, at this time, the operating voltage is a high voltage, and the operating voltage range is 40-50V. The graphene quantum dot layers in the sub pixel units of the whole row all emit blue light B at the driving of the high voltage.

Manufacturing steps of such graphene light emitting display are described below.

In such manufacturing process of the graphene light emitting transistor, the source electrode, the drain electrode and the graphene quantum dot layer are all developed from the graphene thin film. However, in fact, since the source electrode, the drain electrode and the graphene quantum dot layer perform different functions, and their shapes and structures are different, manufacturing steps of the process are also allocated to be performed in independent steps. That is, the steps of manufacturing reduced graphene oxide source electrode and drain electrode patterns and manufacturing semiconductor graphene quantum dot patterns are two independent manufacturing steps.

Figure 2:
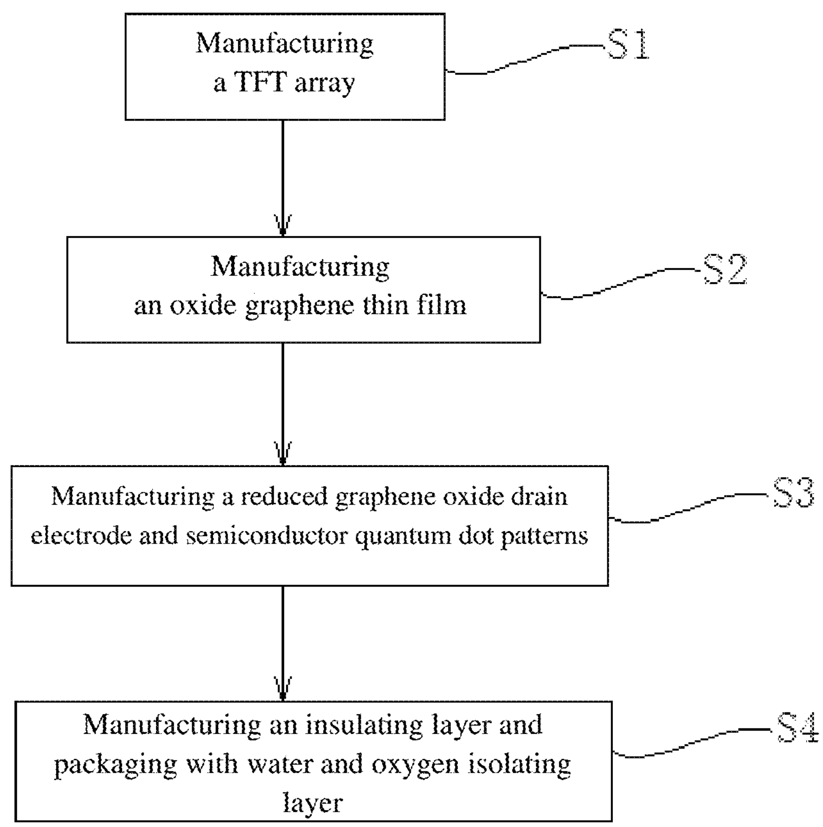
FIG. 2 is a manufacturing flowchart of a graphene light emitting display according to an embodiment of the present disclosure.

In conjunction with FIG. 2, in the manufacturing method of the graphene light emitting display of the present disclosure, the following steps are used:

Step S1: A TFT array, and a gate 11 and a gate insulating layer 12 in the graphene light emitting device are manufactured on a substrate using a vacuum thermal evaporation method to obtain a TFT array substrate. The gate of the graphene light emitting transistor and the gate of TFT also can adopt the same material and manufacturing technology, to further simplify the process.

Step S2: A graphene oxide dispersion is coated evenly on a surface of the TFT array substrate adopting a coating manner, for example, including spinning, spraying, screen printing and the like, to form a graphene oxide thin film 20.

Figure 3:
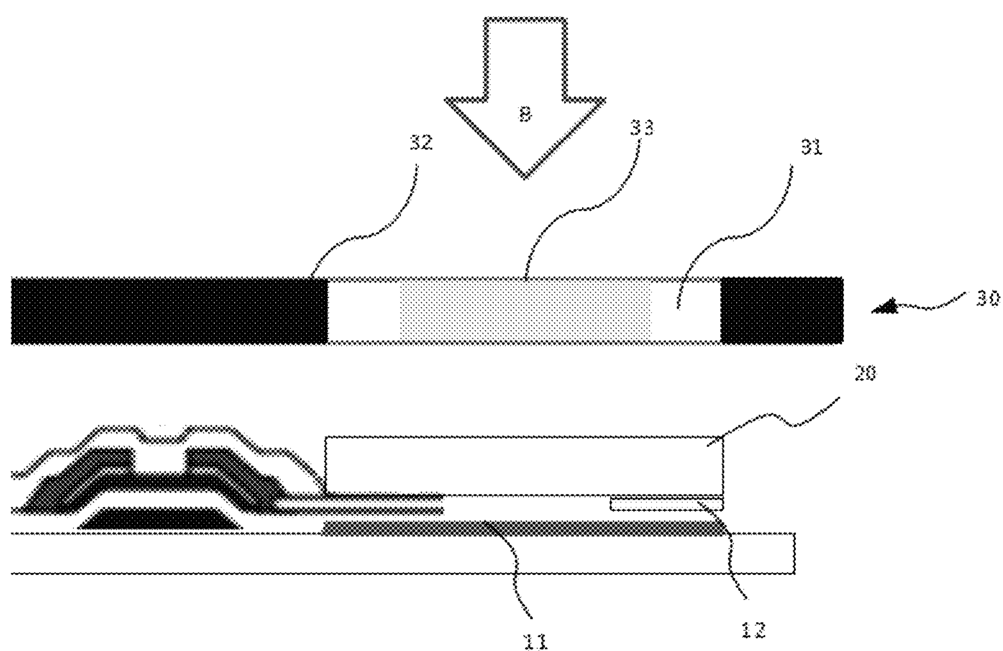
FIG. 3 is a schematic view of using a photomask in a manufacturing process of a graphene light emitting display according to an embodiment of the present disclosure.

Step S3: In conjunction with FIG. 3, the present embodiment provides a photomask 30 corresponding to the graphene oxide thin film, and graphene oxide under the photomask 30 is irradiated by blue light having a high density through the photomask under an inert gas atmosphere, so as to realize manufacturing the reduced graphene oxide source and drain electrodes and the semiconductor quantum dot patterns, making them have different functions. For example, the light of the present embodiment adopts blue light having an operational wavelength of 420-660 nm. The photomask 30 includes: a complete transparent part 31, a light blocking part 32 and a semitransparent part 33, used for making the light be transmitted to different parts.

Then in conjunction with FIG. 1, the complete transparent part 31 corresponds to the region in which the source electrode 14 and the drain electrode 15 on the graphene light emitting transistor are preset to be located. The complete transparent part can make the light (e.g., ultraviolet light) be fully transmitted and reach the graphene oxide thin film, so that the graphene oxide thin film in this region can be fully reduced into graphene, to form a graphene source electrode and a graphene drain electrode. The reduced graphene may have a good thermal and electrical conductivity performance, which is a good material used as a conductive electrode.

Furthermore, the light blocking part 32 corresponds to the region in which a TFT device on the graphene light emitting transistor is preset to be located. The TFT device is sensitive to light, of which the performance can be easily damaged by light irradiation, the corresponding graphene oxide is not irradiated by light due to the light blocking part of the photomask, so that a good insulating characteristic thereof can be retained to protect the TFT device.

The light transmittance of the semitransparent part 33 may be, for example, 30-70% of that of the complete transparent part, and is used to correspond to the region in which the graphene quantum dot layer 16 on the graphene light emitting transistor is preset to be located. The graphene oxide thin film may be gradually reduced to graphene after being irradiated by light for a certain time. The degree of reduction of graphene oxide may be controlled by controlling light intensity and duration, to obtain the optimal performance of the graphene quantum dot layer. In general, the light intensity is controlled by the graphene source electrode; and the turn-on time of the pixel is effected by the refresh frequency, and for the general display, a refresh frequency of 60 Hz or 120 Hz can be satisfied. Thus, the semitransparent part can make the light be partially transmitted to reach the position which needs to be set as a position of the graphene quantum dot layer, so that the graphene oxide thin film is partially reduced.

In conclusion, after the light is irradiated upon the photomask, the graphene oxide under the light blocking part region is not irradiated by light thus shows an insulator characteristic; the light intensity upon the graphene oxide under the semitransparent part region is reduced, thus it is partially reduced and shows a semiconductor characteristic, and the region corresponding to the complete transparent part is a graphene quantum dot; and after the light is irradiated upon the photomask, the graphene oxide under the transparent region is converted to the reduced graphene showing a conductivity characteristic after being irradiated by light, and the corresponding regions are source electrode and drain electrode regions.

Step S4: After the source electrode, the drain electrode and the graphene quantum dot are manufactured, a patterned display device is obtained. The insulating layer and the water and oxygen isolating layer are formed sequentially on a surface of the graphene light emitting transistor, packaging of the display device is completed, and the manufacturing of the graphene light emitting display is obtained.

Although the present disclosure has been described with reference to specific exemplary embodiments, those skilled in the art will understand that various changes in form and details may be made therein without departing from the spirit and scope of the invention as defined by the appended claims and its equivalents.

What is claimed is:

1. A method of manufacturing a graphene light emitting display, comprising the following steps:

coating evenly a graphene oxide dispersion on a surface of the substrate with a thin film transistor formed thereon to form the graphene oxide thin film;

providing a photomask to correspond to the graphene oxide thin film, so that light is radiated to the graphene oxide thin film through the photomask, to form a source electrode, a drain electrode and a graphene quantum dot layer of a graphene light emitting transistor; and forming an insulating layer and a water and oxygen isolating layer sequentially on a surface of a substrate with the graphene light emitting transistor formed thereon;

wherein the photomask includes:

a complete transparent part corresponding to the region in which the source electrode and the drain electrode are located;

a light blocking part corresponding to the region in which the thin film transistor is located; and a semitransparent part corresponding to the region in which the graphene quantum dot layer is located.

2. The method of claim 1, wherein the light is blue light.

3. The method of claim 2, wherein the operational wavelength of the light is 420-660 nm.

4. The method of claim 1, wherein a material for the graphene gate is one of a molybdenum-aluminum alloy, an aluminum-silver alloy and a copper-molybdenum-aluminum alloy.

5. A graphene light emitting display comprising:

a substrate; and a plurality of sub pixel units disposed on the substrate, wherein each of the sub pixel units comprises:

a driving module formed on the substrate;

a switch module formed on the substrate;

a gate formed on the substrate;

a gate insulating layer formed on the gate;

a source electrode formed on the gate insulating layer;

a drain electrode formed on the gate insulating layer; and a graphene quantum dot layer connected between the source electrode and the drain electrode, and wherein the switch module is electrically connected to the source electrode, and the driving module is electrically connected to the gate.

6. The graphene light emitting display of claim 5, wherein the driving module makes the gate have voltage modes including:

a first voltage mode, making the graphene quantum dot layer emit red light;

a second voltage mode, making the graphene quantum dot layer emit green light; and a third voltage mode, making the graphene quantum dot layer emit blue light.

7. The graphene light emitting display of claim 6, wherein:

when the gate is in the first voltage mode, the operating voltage range is 0-12V;

when the gate is in the second voltage mode, the operating voltage range is 20-35V; and when the gate is in the third voltage mode, the operating voltage range is 40-50V.

8. The graphene light emitting display of claim 5, wherein a material for the graphene gate is one of a molybdenum-aluminum alloy, an aluminum-silver alloy and a copper-molybdenum-aluminum alloy.

9. The graphene light emitting display of claim 5, further comprising:

an insulating layer formed on the graphene quantum dot layer;

an oxygen isolating layer formed on the insulating layer; and water between the insulating layer and the oxygen isolating layer.

* * * * *